United States Patent
Christenson

(10) Patent No.: US 9,284,183 B2
(45) Date of Patent: Mar. 15, 2016

(54) METHOD FOR FORMING NORMALLY CLOSED MICROMECHANICAL DEVICE COMPRISING A LATERALLY MOVABLE ELEMENT

(71) Applicant: HT MicroAnalytical, Inc., Albuquerque, NM (US)

(72) Inventor: Todd Richard Christenson, Albuquerque, NM (US)

(73) Assignee: HT MicroAnalytical, Inc., Albuquerque, NM (US)

( * ) Notice: Subject to any disclaimer, the term of this patent is extended or adjusted under 35 U.S.C. 154(b) by 0 days.

(21) Appl. No.: 13/764,424

(22) Filed: Feb. 11, 2013

(65) Prior Publication Data
US 2014/0048395 A1 Feb. 20, 2014

Related U.S. Application Data

(63) Continuation-in-part of application No. 13/587,398, filed on Aug. 16, 2012, now abandoned, which is a continuation of application No. 13/028,855, filed on Feb. 16, 2011, now Pat. No. 8,258,900, which is a (Continued)

(51) Int. Cl.
*H01H 11/00* (2006.01)
*H01H 65/00* (2006.01)
(Continued)

(52) U.S. Cl.
CPC ............ *B81B 3/0054* (2013.01); *H01H 50/005* (2013.01); *H01H 2001/0078* (2013.01); *H01H 2050/007* (2013.01); *Y10T 29/49826* (2015.01)

(58) Field of Classification Search
CPC ............ H01H 59/0009; H01H 1/0036; H01H 2001/0078; H01H 2001/0052; H01H 2001/0084; H01H 2050/007; B81B 2203/0118; B81B 2207/053; B81C 1/00476
USPC ............ 29/622, 428, 825, 846, 876; 257/254, 257/415; 333/101, 105, 133, 187, 189, 262
See application file for complete search history.

(56) References Cited

U.S. PATENT DOCUMENTS 3,652,962 A 3/1972 Preux
5,398,011 A 3/1995 Kimura et al.
(Continued)

FOREIGN PATENT DOCUMENTS

CN 1601682 A 3/2005
EP 1191559 A2 3/2002
(Continued)

OTHER PUBLICATIONS

Mohamad A. Musleh, "Related U.S. Appl. No. 13/602,805 Office Action", Mar. 28, 2013, Publisher: USPTO, Published in: US.
(Continued)

*Primary Examiner* — Thiem Phan
(74) *Attorney, Agent, or Firm* — Laplan Breyer Schwarz & Ottesen, LLP

(57) ABSTRACT

A micromechanical device and a method for forming the device is disclosed, wherein the micromechanical device has a laterally movable mechanically active element that has a quiescent position in which it is in physical contact with a second structural element. The device is fabricating by disposing the mechanically active element on a first substrate and disposing the second structural element on a second substrate. After the two substrates are aligned and joined such that both the mechanically active element and the second structural element are in contact and affixed to one of the substrates, the other substrate is removed leaving all structural elements disposed on a single substrate.

8 Claims, 13 Drawing Sheets

Related U.S. Application Data continuation of application No. 11/367,890, filed on Mar. 3, 2006, now Pat. No. 7,999,642.

(60) Provisional application No. 60/658,902, filed on Mar. 4, 2005, provisional application No. 60/658,987, filed on Mar. 4, 2005.

(51) Int. Cl.
  *B81B 3/00*  (2006.01)
  *H01H 50/00* (2006.01)
  *H01H 1/00*  (2006.01)

(56) References Cited

U.S. PATENT DOCUMENTS

| | | | |
|---|---|---|---|
| 5,472,539 A | 12/1995 | Saia et al. | |
| 6,084,281 A | 7/2000 | Fullin et al. | |
| 6,094,116 A | 7/2000 | Tai et al. | |
| 6,310,526 B1 | 10/2001 | Yip et al. | |
| 6,366,186 B1 | 4/2002 | Hill et al. | |
| 6,469,603 B1 | 10/2002 | Ruan et al. | |
| 6,548,841 B2 * | 4/2003 | Frazier et al. | 257/254 |
| 6,809,412 B1 | 10/2004 | Tourino et al. | |
| 6,859,122 B2 | 2/2005 | Divoux et al. | |
| 6,894,592 B2 | 5/2005 | Shen et al. | |
| 6,975,193 B2 | 12/2005 | Knieser et al. | |
| 7,830,227 B1 * | 11/2010 | Chang et al. | 333/133 |
| 7,902,946 B2 | 3/2011 | Niblock | |
| 8,436,701 B2 | 5/2013 | Baks et al. | |
| 2003/0030998 A1 | 2/2003 | Mhani et al. | |
| 2003/0107460 A1 | 6/2003 | Huang | |
| 2003/0122640 A1 | 7/2003 | Deligianni et al. | |
| 2003/0137374 A1 | 7/2003 | Ruan et al. | |
| 2003/0210115 A1 | 11/2003 | Kubby et al. | |
| 2004/0017275 A1 | 1/2004 | Cornelus Van Gastel | |
| 2006/0049900 A1 | 3/2006 | Ruan et al. | |
| 2010/0182111 A1 | 7/2010 | Hagihara et al. | |
| 2010/0295638 A1 | 11/2010 | Hopper et al. | |

FOREIGN PATENT DOCUMENTS

| | | |
|---|---|---|
| JP | 2000-348594 A | 12/2000 |
| JP | 2003-311698 A | 11/2003 |
| JP | 2005-108471 A | 4/2005 |
| JP | 2005-317360 A | 11/2005 |
| JP | 2008-243450 A | 10/2008 |
| WO | 2005015595 A1 | 2/2005 |

OTHER PUBLICATIONS

"Related JP Patent Application No: 2011-500937 Office Action", Apr. 15, 2013, Publisher: JPO, Published in: JP.

Musleh, Mohamad A., "Related U.S. Appl. No. 12/725,168 Office Action", Jun. 17, 2013, Publisher: USPTO, Published in: US.

Musleh, Mohamad A., "Related U.S. Appl. No. 12/725,168 Office Action", Oct. 10, 2013, Publisher: USPTO, Published in: US.

Mohamad A. Musleh, "Related U.S. Appl. No: 12/725,168 Office Action—Restriction", Apr. 4, 2013, Publisher: USPTO, Published in: US.

"Related CN Patent Application No: CN 2009801181783 Office Action", Jan. 29, 2013, Publisher: CIPO, Published in: Cn.

Bernard Rojas, "Related U.S. Appl. No: 13/587,398 Office Action", Jan. 18, 2013, Publisher: USPTO, Published in: US.

Socher, Guenther, "EP Application No. 06737141.9 European Search Report Mar. 31, 2011",, Publisher: EPO, Published in: EP.

Deue, Lydia, "PCT Application No. PCT/US2006/07926 International Preliminary Report on Patentability Sep. 12, 2007",, Publisher: PCT, Published in: PCT.

Deue, Lydia, "PCT Application No. PCT/US2006/07926 International Search Report Apr. 25, 2007",, Publisher: PCT, Published in: PCT.

Rojas, Bernard, "U.S. Appl. No. 11/367,890 Notice of Allowance Apr. 18, 2011",, Publisher: USPTO, Published in: US.

Rojas, Bernard, "U.S. Appl. No. 11/367,890 Office Action Dec. 23, 2010", Publisher: USPTO, Published in: US.

Rojas, Bernard, "U.S. Appl. No. 11/367,890 Office Action Jan. 4, 2010",, Publisher: USPTO, Published in: US.

Rojas, Bernard, "U.S. Appl. No. 11/367,890 Office Action May 29, 2009",, Publisher: USPTO, Published in: US.

Rojas, Bernard, "U.S. Appl. No. 11/367,890 Office Action Jul. 7, 2010",, Publisher: USPTO, Published in: US.

Rojas, Bernard, "U.S. Appl. No. 11/367,890 Restriction Requirement Sep. 15, 2008",, Publisher: USPTO, Published in: US.

Rojas, Bernard, "U.S. Appl. No. 13/028,855 Restriction Requirement Apr. 29, 2011",, Publisher: USPTO, Published in: US.

"Final Office Action issued in co-pending U.S. Appl. No. 14/085,267", Aug. 4, 2015, Publisher: USPTO, Published in: US.

* cited by examiner

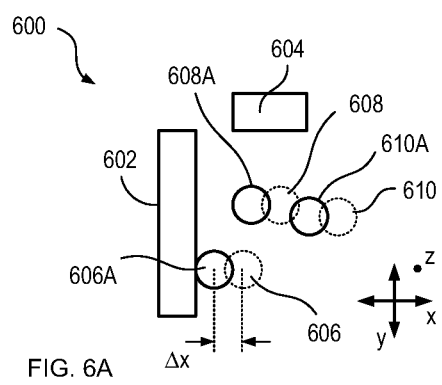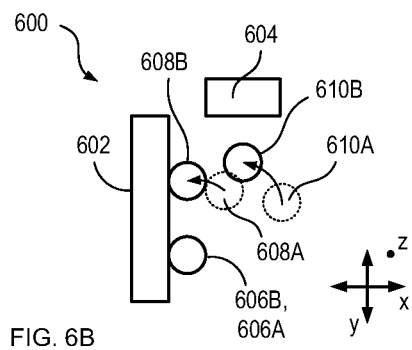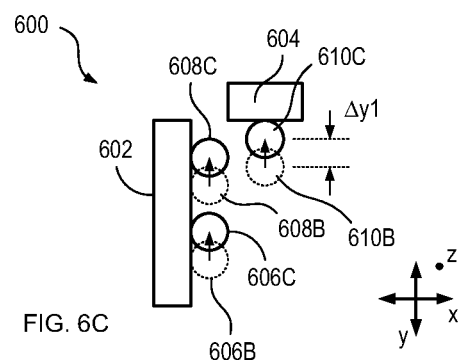

View through a-a

METHOD FOR FORMING NORMALLY CLOSED MICROMECHANICAL DEVICE COMPRISING A LATERALLY MOVABLE ELEMENT

CROSS REFERENCE TO RELATED APPLICATIONS

This case is a continuation-in-part of co-pending U.S. patent application Ser. No. 13/587,398, filed Aug. 16, 2012, which is a continuation of U.S. patent application Ser. No. 13/028,855 (now U.S. Pat. No. 8,258,900), filed Feb. 16, 2011, which is a continuation of U.S. patent application Ser. No. 11/367,890 (now U.S. Pat. No. 7,999,642), filed Mar. 3, 2006, which claims the benefit of U.S. Provisional Application Ser. No. 60/658,957, filed on Mar. 4, 2005 and U.S. Provisional Application Ser. No. 60/658,902, filed on Mar. 4, 2005, all of which are incorporated herein by reference.

If there are any contradictions or inconsistencies in language between this application and one or more of the cases that have been incorporated by reference that might affect the interpretation of the claims in this case, the claims in this case should be interpreted to be consistent with the language in this case.

FIELD OF THE INVENTION

The present invention relates to micromechanical devices in general, and, more particularly, to normally closed micromechanical switches and valves.

BACKGROUND OF THE INVENTION

Micromechanical devices are used in many applications such as pressure sensing, acceleration sensing, medical diagnostics, surgical systems, and environmental sensing. Originally, micromechanical devices were commonly based on Micro Electro Mechanical Systems (MEMS) technology, in which integrated circuit fabrication techniques are exploited to make micron-scale mechanically active devices and systems. More recently, the field of micromechanics has also come to include nanometer-scale, nanotechnology-based devices and related technology.

Historically, micromechanical device have been made using planar processing techniques, wherein a series of layers of structural material and sacrificial material are deposited and patterned into their desired shapes on a substrate in sequential fashion. By appropriately shaping each successive layer of structural material, a three-dimensional structure can be developed from multiple two-dimensional layers. If an element of the structure is intended to be mechanically active, the structural material of that element is encased in sacrificial material so that it is not locked into contact with other structural material or the underlying substrate.

Once the structure of the micromechanical device is fully formed, the sacrificial material is removed in what is referred to as a "release etch," which frees the structural material of the mechanically active element by selectively removing the sacrificial material in which it is encased. This renders the element movable with respect to the underlying substrate, as well as other structural material disposed on the substrate.

Because an element must be surrounded by sacrificial material in order to enable its motion after release, it is difficult to fabricate a micromechanical device having a mechanically active element whose unactuated (i.e., quiescent) position leaves it in contact with another structural element on the substrate. Instead, after the release etch, a typical mechanically active element is left separated from other structural elements (or the substrate) by a gap that is substantially equal to the thickness of the sacrificial material removed during the release etch. Only by imparting a force on the mechanically active element (e.g., by means of an actuator) after it has been released can it be brought into contact with the other structural element.

In many applications for micromechanical devices, however, a quiescent state wherein a mechanically active element is in contact with another element is highly desirable. In a microfluidic application, for example, it is often desirable that a flow valve is closed in the absence of power to the device. Or, in a microrelay system, a normally closed device would provide greater system design flexibility and, often, reduced system complexity. A micromechanical device having a normally closed state, therefore, would be an important advance in the state-of-the art.

SUMMARY OF THE INVENTION

The present invention enables formation of a micromechanical device having a first structural element that is laterally movable, wherein the device has (1) a quiescent state wherein first structural element is in physical contact with a second structural element, and (2) an actuated state wherein the first structural element is not in physical contact with the second structural element. Embodiments of the present invention are particularly well suited for use in normally closed electrical relays and normally closed microfluidic valves.

An illustrative embodiment of the present invention includes a method for forming a normally closed micromechanical device on a first substrate. The micromechanical device includes a movable element that extends from an anchor affixed to the first substrate. The movable element includes a free end that moves laterally from its unactuated position in contact with a contact structure affixed to the first substrate, to an actuated position not in contact with the contact structure. The method includes disposing one of the movable element (and its anchor) and the contact structure on the first substrate and disposing the other of the movable element and the contact structure on a second substrate that includes a first base substrate. The two substrates are then assembled and bonded in a manner that results in (1) both the anchor and the contact structure being affixed to the first substrate and (2) the free end of the movable element being in physical contact with the contact structure. After bonding, the first base substrate is removed, leaving a single substrate on which the complete normally closed micromechanical device resides.

An embodiment of the present invention is a normally closed micromechanical reed relay comprising a reed that cantilevers from an anchor disposed on a substrate. The free end of the reed is selectively movable in a direction parallel to the substrate from its quiescent position, where it is in physical contact with a contact structure, to an actuated position, where it is not in physical contact with the contact structure. The free end is moved by a magnetic actuator comprising a pair of magnetic poles disposed on the substrate and an armature that is physically connected to the reed. In the illustrative embodiment, the anchor is also a first electrical contact and the contact structure includes a second contact. The reed is electrically conductive; therefore, when the free end is in its quiescent position, the first and second electrical contacts are electrically connected via the reed. When the free end is in its actuated position, the first and second electrical contacts are not electrically connected via the reed.

In some embodiments, additional structural elements are formed on a third substrate having a second base substrate. The third substrate and first substrate are then assembled and bonded together. After bonding, the second base substrate is removed, resulting in a single substrate on which all the structural elements formed on the three substrates reside. In some of these embodiments, at least one of the structural elements formed on the third substrate has a quiescent position in which it is in physical contact with at least one structural element residing on the first substrate. In some of these embodiments, none of the structural elements formed on the third substrate has a quiescent position in which it is in physical contact with at least one structural element residing on the first substrate.

In some embodiments, the method includes inducing a strain in the movable element so as to mechanically preload the normally closed structure. For an application such as an electrical relay, for example, high contact force is desirable because it lowers the contact resistance of the relay. For an application such as a microfluidic valve, high contact force improves valve reliability and improves the standoff pressure of the valve.

In some embodiments, the actuator that moves the movable element is other than an electromagnetic actuator, such as an electrostatic actuator, external magnet actuator, thermal actuator, piezoelectric actuator, microfluidic actuator, or magnetostrictive actuator.

In some embodiments of the present invention, a layer of low-resistivity material is disposed on a vertical contact surface of the movable element. The ability to provide a layer of low-resistance material on a substantially vertical surface is facilitated by the fact that the first end and second anchor are fabricated on separate substrates.

An embodiment of the present invention comprises a micromechanical device comprising: a first substrate that defines a first plane; a first anchor disposed on the first substrate, the first anchor being substantially immovable with respect to the first substrate; a movable element that is attached to the first anchor at a first end, the movable element having a second end that is selectively movable along a first direction that is substantially parallel with the first plane; and a first contact structure disposed on the first substrate, the first contact structure being substantially immovable with respect to the first substrate; wherein movable element is dimensioned and arranged such that it has (1) a quiescent position in which the second end and first contact structure are in physical contact, and (2) an actuated position in which the second end and first contact structure are physically disconnected.

BRIEF DESCRIPTION OF THE DRAWINGS

FIG. 6A-C depict schematic drawings of top views of an alignment system suitable for use with the illustrative embodiment of the present invention at different phases of substrate alignment.

DETAILED DESCRIPTION

Figure 1:
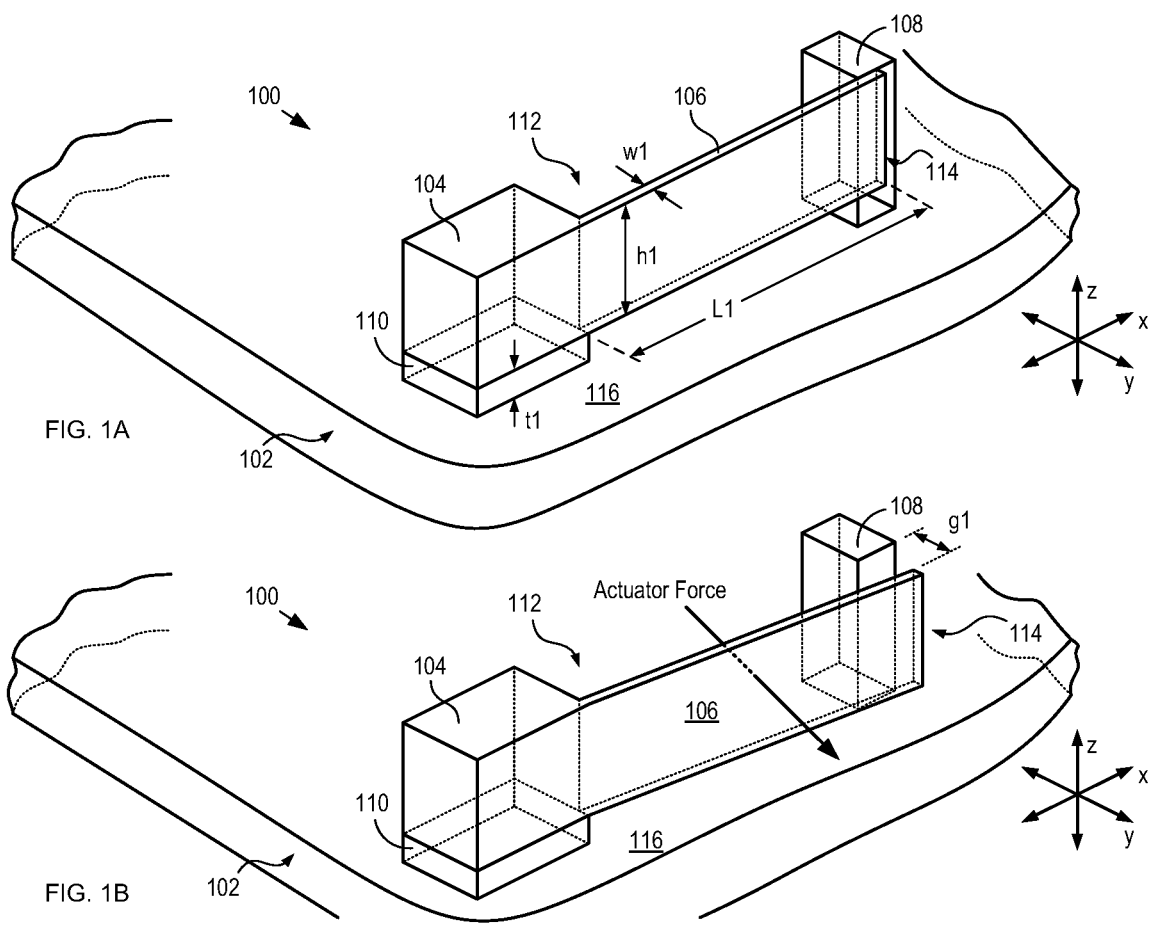
FIGS. 1A-B depict schematic drawings of a perspective view of salient features of a laterally actuated, normally closed micromechanical device in its quiescent and actuated state, respectively, in accordance with an illustrative embodiment of the present invention.

The following terms are defined for use in this Specification, including the appended claims:

Micromechanical device is defined as a device formed using integrated circuit and/or microfabrication and/or nanofabrication techniques, wherein the device has at least one element that is mechanically active (i.e., movable with respect to another portion of the device or an underlying substrate).

Disposed on or Formed on is defined as "exists, at least in part, on" an underlying material or layer. This layer may comprise intermediate layers. For example, if an element is described to be "disposed (or grown) on a substrate," this can mean that at least a portion of the element is either (1) in intimate contact with the substrate; or (2) in contact with one or more intermediate layers or elements that reside on the substrate and are between the substrate and the element.

High-aspect-ratio fabrication is defined as fabrication of an element having a height to width ratio of at least 10:1, wherein the width of the element is defined via photolithography. Typically, a high-aspect ratio element has a width that is 10-20 microns or less, although wider elements can still be considered high-aspect-ratio elements.

Aligned is defined as meaning parallel and/or co-incident. In other words, any two lines that intersect (or whose projections onto the same plane intersect) at any angle that is an integer multiple of $\pi$ are aligned. For example: two lines that are directed, in either direction, along the x-axis but are not coplanar are aligned, two lines that are directed, in either direction, along the x-axis and are coplanar but are not coincident are aligned; and to lines that are directed, in either direction, along the x-axis, are coplanar, and are co-incident are aligned.

The present invention enables a micromechanical device having first element that has a quiescent position in which it is in contact with a second element disposed on the substrate, and an actuated position in which it is not in contact with the second element. In other words, the present invention enables a "normally closed" micromechanical device.

FIGS. 1A-B depict schematic drawings of a perspective view of salient features of a laterally actuated, normally closed micromechanical device in its quiescent and actuated state, respectively, in accordance with an illustrative embodiment of the present invention. Device 100 comprises substrate 102, anchor 104, movable element 106, contact structure 108, and spacer pad 110.

Figure 2:
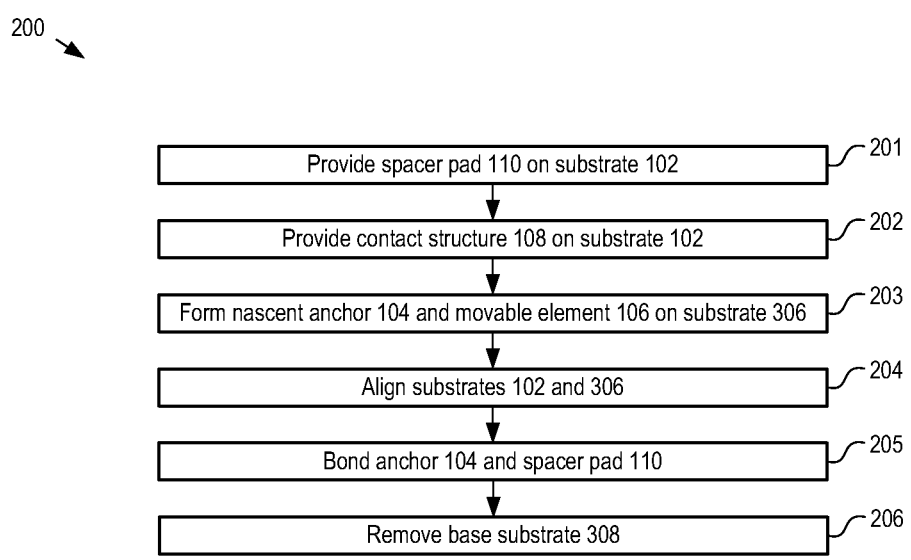
FIG. 2 depicts operations of a method suitable for forming a laterally actuated, normally closed micromechanical device in accordance with the illustrative embodiment of the present invention.

FIG. 2 depicts operations of a method suitable for forming a laterally actuated, normally closed micromechanical device in accordance with the illustrative embodiment of the present invention. Method 200 begins with operation 201, wherein spacer pad 110 is formed on substrate 102. Method 200 is described here with continuing reference to FIGS. 1A-B, as well as reference to FIGS. 3-5.

Substrate 102 is at least a portion of a conventional substrate suitable for processing using standard planar processing techniques, such as those used to fabricate integrated circuits, Micro-Electro-Mechanical Systems-based devices, or nanotechnology devices. In the illustrative embodiment, substrate 102 is a portion of a standard silicon wafer; however, substrates suitable for use with the present invention include any substrate compatible with wafer-level fabrication. Substrates suitable for use with the present invention include, without limitation, semiconductor-on-insulator (SDI) substrates, semiconductor substrates (e.g., compound semiconductor, germanium, etc.), ceramic substrates, glass substrates, alumina substrates, and composite material substrates.

Spacer pad 110 is a region of material suitable for mechanically bonding with the material of anchor 104. In some embodiments of the present invention, spacer pad 110 enables electrical connection between anchor 104 and an electrical trace or through-wafer via disposed beneath spacer pad 110. Spacer pad 110 is formed with a thickness of t1 via any of a number of conventional planar processing methods, or combinations thereof, such as evaporation, sputtering, electroplating, relieving surface 116 via etching to form a raised pedestal that acts as spacer pad 110, and the like.

At operation 202, contact structure 108 is provided on substrate 102.

Contact structure 108 is provided on surface 116 such that it is substantially immovable with respect to substrate 102. In some embodiments, contact structure 108 is formed on substrate 102 via a conventional deposition process, such as electroplating, evaporation, sputtering. In some embodiments, contact structure 108 is formed on another substrate and bonded onto substrate 102. In some embodiments, contact structure 108 is mechanically attached to substrate 102 via a spacer pad. Contact structure 108 comprises a material that is compatible for operation with movable element 106. In some embodiments, contact structure 108 includes the same material as element 108. In some embodiments, contact structure 108 comprises a material different from that of movable element 106.

Figure 3A:
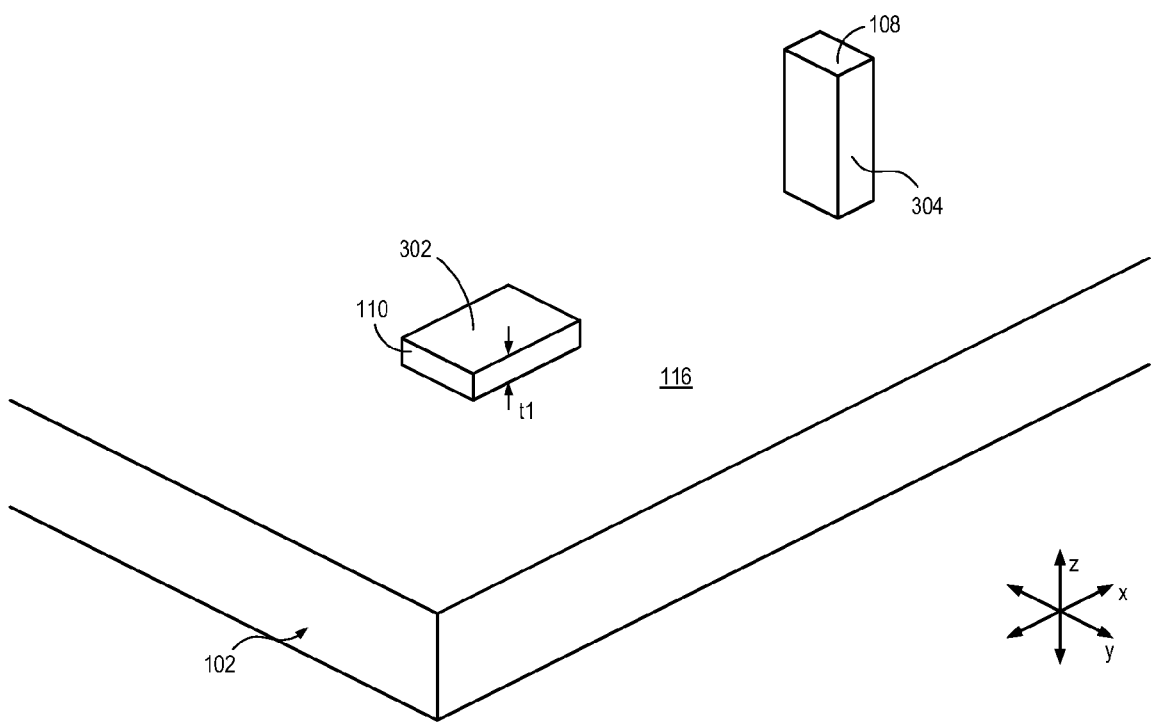
FIG. 3A depicts a schematic drawing of a perspective view of substrate 102 after formation of spacer pad 110 and contact structure 108 on surface 116.

FIG. 3A depicts a schematic drawing of a perspective view of substrate 102 after formation of spacer pad 110 and contact structure 108 on surface 116.

At operation 203, nascent anchor 104 and nascent movable element 106 are formed on substrate 306. Nascent movable element 106 includes first end 112, which is attached to nascent anchor 104, and second end 114, which is unattached to any other structural element.

Figure 3B:
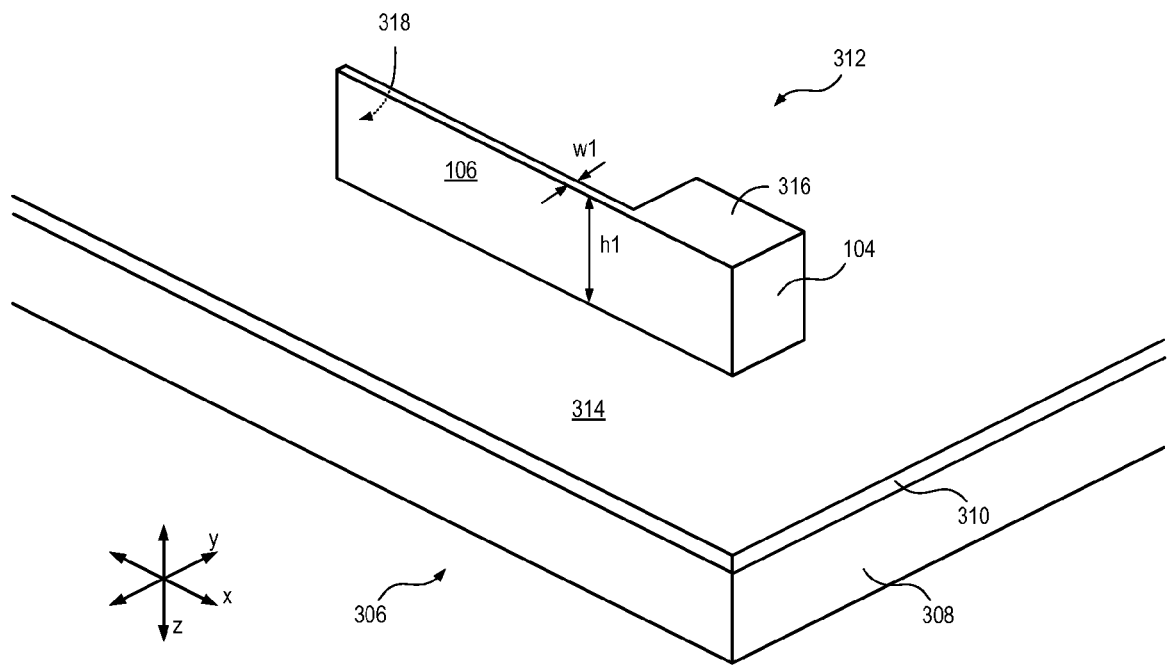
FIG. 3B depicts a schematic drawing of a perspective view of substrate 306 after the formation of the structural elements of anchor 104 and movable element 106.

FIG. 3B depicts a schematic drawing of a perspective view of substrate 306 after the formation of the structural elements of anchor 104 and movable element 106.

Substrate 306 is at least a portion of a substrate suitable for use in planar processing operations. Substrate 306 includes base substrate 308 and release layer 310. In some embodiments, substrate 306 does not include a release layer.

Base substrate 308 is analogous to substrate 102, described above and with respect to FIGS. 1A-B.

Release layer 310 is a layer of material that enables the removal of base substrate 308 after substrates 102 and 306 are joined together. It will be clear to one skilled in the art how to specify, make, and use base substrate 308 and release layer 310. In some embodiments, substrate 306 does not include release layer 310.

Element 312 is a structural element comprising the features of anchor 104 and movable element 106. Element 312 is formed on release layer 310 using high-aspect-ratio fabrication such that movable element 106 is a beam having length L1, width w1, and height, h1, where the ratio of h1 to w1 is equal to or greater than ~10:1, and preferably at least 50:1.

High-aspect-ration fabrication enables a mechanically active element whose operating characteristics are primarily defined by its physical dimensions. Since high-aspect-ratio fabrication relies on photolithography and etching or mold filling to precisely "sculpt" the element into its desired shape, the physical dimensions and operating characteristics (e.g., resiliency, actuation force, operating speed, etc.) of the mechanically active element can be carefully controlled and are exceptionally repeatable.

For example, the actuator force, F, required to deflect second end 114 of movable element 106 (after device 100 is fully formed) by a deflection distance, δ, along the y-direction (as shown in FIG. 1) can be described by:

$$F = \frac{\delta E h1}{4}\left(\frac{w1}{L1}\right)^3; \qquad (1)$$

where E is the Young's modulus of the material of movable element 106, and h1, w1, and L1 are photolithographically defined. It should be noted that no term for material stress is included in Eq. (1), since laterally directed stress is not normally present in a deposited layer of structural material.

High-aspect-ration fabrication also facilitates forming a mechanically active element that is selectively movable along a direction that is substantially parallel to the plane of its underlying substrate. In-plane dimensions can be of the same order as the critical dimension of the photolithography used to define them, while the depth to which a feature can be formed in the photoresist defines the limit for out-of-plane dimensions. As a result, a mechanically active element can be fabricated with high out-of-plane stiffness, but low stiffness along a direction parallel with the substrate.

In contrast, prior-art micromechanical devices are normally vertically actuated. A vertically actuated micromechanical device has a mechanically active element that moves along a direction substantially perpendicular to the plane of its underlying substrate. Typically, moveable element is characterized by vertically oriented residual stress and stress gradients that develop through the thickness of a layer of structural material during its deposition. In many cases, the stress gradient results in deformation of the mechanically active element upon its release from the substrate (either away from or toward its underlying substrate). Unfortunately, control of residual stress and stress gradients is difficult; therefore, it is difficult to control the quiescent position of the mechanically active element. In addition, it is difficult to control the magnitude of force necessary to move the mechanically active element because the stress of the deposited material and, therefore, the stiffness of the mechanically active element, is unpredictable. Further, the thickness of the vertically movable element is determined by the thickness of the layer and is, therefore, limited to the maximum thickness for which a deposited layer can be formed.

By employing high-aspect-ratio fabrication to form a laterally moving mechanically active element, the operating characteristics of a laterally actuated device can be substantially decoupled from deleterious effects that arise from film stress, thickness variations, stress gradient variations, and the like. For these reasons, a laterally actuated, micromechanical device offers greater design latitude, better reliability, and improved performance than a vertically actuated device.

High-aspect-ratio fabrication of element 312 begins with the deposition of a thick-film photoresist having a thickness substantially equal to h1. The desired lateral dimensions of element 312 are then defined in the photoresist layer via conventional fine-line lithography and photoresist development. This yields in a cavity in the photoresist layer that is suitable to act as a mold for the structural material of element 312.

After its definition, the mold is filled with structural material using electroplating to form the structure of element 312. The choice of the structural material used in element 312 is application dependent. Materials suitable for use in movable element 106 and anchor 104 include, without limitation, metals, semiconductors (e.g., silicon, silicon carbide, germanium, III-V materials, II-VI materials, etc.), ceramics, composite materials, ferromagnetic materials, glasses, and the like.

After removal of the photoresist mold, freestanding element 312 (i.e., nascent anchor 104 and nascent movable element 106) resides on release layer 310, as depicted in FIG. 3B.

The combination of thick-film photoresist and fine-line photolithography enables the height, h1, of movable element 106 to be at least an order of magnitude greater than its thickness, w1. In addition, thickness w1 is controlled with photolithographic precision that provides exceptional uniformity along its length, L1, as well as excellent repeatability for devices on a single wafer or from wafer to wafer during fabrication.

Although one method of high-aspect-ratio fabrication is described here, it will be clear to one skilled in the art, after reading this Specification, how to specify, make, and use alternative embodiments of the present invention wherein a different method of high-aspect-ratio fabrication is used to form at least some of elements of a micromechanical device. Further, one skilled in the art will recognize that, in some embodiments of the present invention, the choice of high-aspect-ratio fabrication technology employed is based on choice of structural material used for anchor 104 and movable element 106.

At operation 204, substrate 102 and substrate 306 are aligned.

Figure 4:
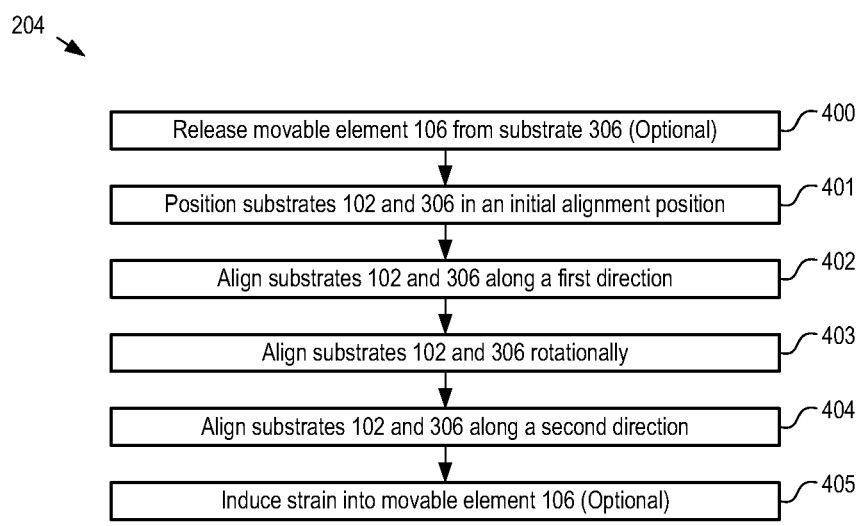
FIG. 4 depicts sub-operations of an operation suitable for aligning two substrates in accordance with the illustrative embodiment of the present invention.

FIG. 4 depicts sub-operations of an operation suitable for aligning two substrates in accordance with the illustrative embodiment of the present invention. Operation 204 begins with sub-operation 401, in which substrates 102 and 306 are placed into an initial alignment position.

During sub-operation 401, substrate 306 is flipped so that surface 302 of spacer pad 110 is facing surface 316 of nascent anchor 104. Surfaces 302 and 316 are then brought into physical contact. Surface 318 of nascent movable element 106 is not in put into contact with surface 304 of contact structure 108 during sub-operation 401, however.

Figure 5A:
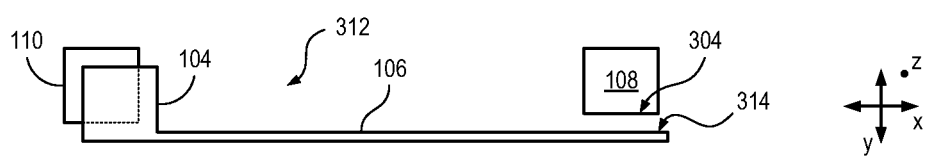
FIG. 5A depicts a schematic drawing of a top view of spacer pad 110, contact structure 108, and element 312 when substrates 102 and 306 are in their initial alignment position.

FIG. 5A depicts a schematic drawing of a top view of spacer pad 110, contact structure 108, and element 312 when substrates 102 and 306 are in their initial alignment position. For clarity, substrates 102 and 306 are not shown in the FIG. 5A.

At sub-operation 402, substrates 102 and 306 are aligned in a first direction.

During sub-operation 402, relative motion, Δx, is induced between substrates 102 and 306 to bring anchor 104 and spacer pad 110 into alignment along the x-direction. In the illustrative embodiment, moving substrate 302 while substrate 102 remains stationary induces the relative motion between the substrates. In some embodiments, substrate 102 is moved while substrate 302 remains stationary. In some embodiments, both substrates are moved.

Figure 5B:
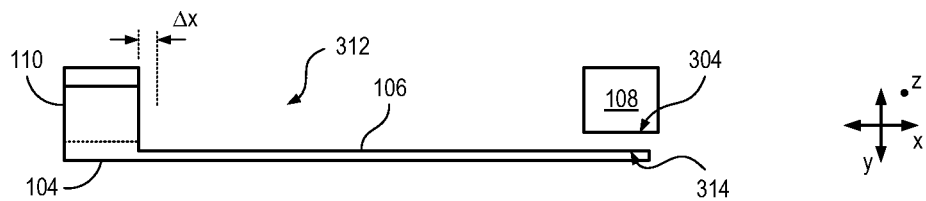
FIG. 5B depicts a schematic drawing of a top view of spacer pad 110, contact structure 108, and element 312 when substrates 102 and 306 are aligned along the x-direction.

FIG. 5B depicts a schematic drawing of a top view of spacer pad 110, contact structure 108, and element 312 when substrates 102 and 306 are aligned along the x-direction. For clarity, substrates 102 and 306 are not shown in the FIG. 5B. It should be noted that, in the illustrative embodiment, the relative motion between the substrates is induced while surfaces 304 and 314 are not in contact with one another to avoid damage to these surfaces.

At sub-operation 403, substrates 102 and 306 are rotationally aligned about the z-axis. In some embodiments, sub-operation 403 is included in either sub-operation 402 or sub-operation 404.

At sub-operation 404, substrates 102 and 306 are aligned in a second direction that is substantially orthogonal with the first direction.

During sub-operation 404, relative motion, Δy1, is induced between substrates 102 and 306 to bring anchor 104 and spacer pad 110 into alignment along the y-direction.

Figure 5C:
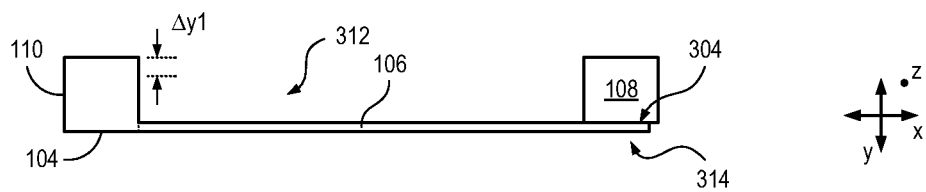
FIG. 5C depicts a schematic drawing of a top view of spacer pad 110, contact structure 108, and element 312 when substrates 102 and 306 are aligned along both the x- and y-directions and about the z-axis.

FIG. 5C depicts a schematic drawing of a top view of spacer pad 110, contact structure 108, and element 312 when substrates 102 and 306 are aligned along both the x- and y-directions and about the z-axis. For clarity, substrates 102 and 306 are not shown in the FIG. 5C. It should be noted that, in the illustrative embodiment, the relative motion between the substrates along the y-direction leaves surfaces 304 and 314 in physical contact.

In some embodiments, it is desirable to mechanically pre-load movable member 106 with a pre-determined level of strain. This enables a higher contact force between surfaces 304 and 314. Higher contact force between these surfaces can, for example, facilitate low electrical contact resistance between them, or increase the pressure a microfluidic valve can withstand without leakage. In order to mechanically pre-load movable member 106, however, it must be made mechanically active relative to substrate 306 prior to placing substrates 102 and 306 into their initial alignment position. As a result, in such embodiments, additional sub-operations are included for operation 204 as follows.

First, at optional sub-operation 400, movable element 106 is made mechanically active relative to substrate 306. In some embodiments, this is accomplished by subjecting substrate 306, after element 312 has been formed, to a short exposure to an etchant that substantially selectively removes the material of release layer 310. Since at least one dimension of movable element 106 (e.g., width, w1) is typically significantly less than the lateral dimensions of anchor 104, a timed etch enables the removal of sufficient release layer material to free the movable element without completely detaching element 312 from substrate 306.

At optional sub-operation 405, after surfaces 304 and 314 have made contact, additional motion along the y-direction, $\Delta y2$, is induced between substrates 102 and 306. The magnitude of $\Delta y2$ is selected to rise to a desired amount of strain in movable element 106, thereby mechanically preloading the element. This leaves movable element 106 with stored mechanical energy when the movable element is in its quiescent position, wherein the stored mechanical energy has a component directed along a direction substantially parallel with plane 320, which is defined by surface 116 of substrates 102.

Figure 5D:
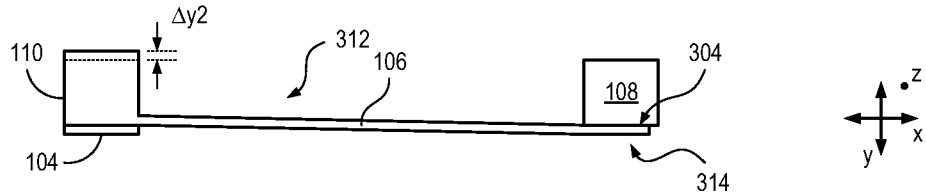
FIG. 5D depicts a schematic drawing of a top view of spacer pad 110, contact structure 108, and element 312 when substrates 102 and 306 are aligned along both the x- and y-directions and about the z-axis such that a mechanical pre-bias is induced in movable member 106.

FIG. 5D depicts a schematic drawing of a top view of spacer pad 110, contact structure 108, and element 312 when substrates 102 and 306 are aligned along both the x- and y-directions and about the z-axis such that a mechanical pre-bias is induced in movable member 106. For clarity, substrates 102 and 306 are not shown in the FIG. 5D.

Although in the illustrative embodiment, relative motion between the substrates along the x-direction is induced while surfaces 304 and 314 are not in contact, one skilled in the art will recognize that, in some cases, it is desirable to induce this relative motion while surfaces 304 and 314 are in contact with one another. Such wiping contact between the surfaces can, for example, facilitate good electrical contact or improve the fluidic seal between the two surfaces.

Further, one skilled in the art will recognize, after reading this Specification, that anchor 104 and movable element 106 can be provided on substrate 306, while contact structure 108 is provided on substrate 102, in accordance with the present invention.

In some embodiments, alignments structures are included on one or both of substrates 102 and 306 to facilitate obtaining their proper alignment.

FIG. 6A-C depict schematic drawings of top views of an alignment system suitable for use with the illustrative embodiment of the present invention at different phases of substrate alignment. Alignment system 600 includes shoulders 602 and 604, disposed on substrate 102, and pins 606, 608, and 610, disposed on substrate 306. Alignment system 600 can be used to facilitate active alignment of substrates 102 and 306 or, in some embodiments, to enable passive fine alignment of substrates 102 and 306. For clarity, substrates 102 and 306 are not depicted in FIGS. 6A-C.

One skilled in the art will recognize, after reading this Specification, that shoulders 602 and 604 and pins 606, 608, and 610 can be distributed between substrates 102 and 306 in any practical manner, with any feature being disposed on either of the two substrates. Further, one skilled in the art will recognize that shoulders 602 and 604 and pins 606, 608, and 610 represent merely one example of an alignment feature set and myriad alternative alignment feature sets are suitable for use with the present invention.

FIG. 6A depicts alignment system 600 before and after operation 402, during which substrates 102 and 306 are aligned along the x-direction. During operation 402, substrate 306 moves along the x-direction by a distance $\Delta x$, when pin 606 reaches position 606A. At this point, shoulder 602 stops further translation of the substrate along the x-direction. In FIG. 6A, the positions of pins 606, 608, and 610 are depicted as dashed circles when substrate 306 is in its initial alignment position prior to operation 402. The pins are depicted as solid-line circles and denoted as pins 606A, 608A, and 610A after substrate 306 is translated along the x-direction by distance $\Delta x$.

FIG. 6B depicts alignment system 600 before and after operation 403, during which substrate 306 is rotated about the z-axis to rotationally align substrates 102 and 306. During operation 403, substrate 306 rotates about the z-axis until pin 608 reaches position 608A. At this point, shoulder 602 stops further rotation of the substrate. In FIG. 6B, the positions of pins 606, 608, and 610 are depicted as dashed circles (denoted as pins 606A, 608A, and 610A) prior to operation 403 and as solid-line circles (denoted as pins 606B, 608B, and 610B) after operation 403.

FIG. 6C depicts alignment system 600 before and after operation 404, during which substrates 102 and 306 are aligned along the y-direction. During operation 404, substrate 306 moves along the y-direction by a distance $\Delta y1$, when pin 606 reaches position 606 A. At this point, shoulder 602 stops further translation of the substrate along the x-direction. In FIG. 6C, the positions of pins 606, 608, and 610 are depicted as dashed circles (denoted as pins 606B, 608B, and 610B) prior to operation 404 and as solid-line circles (denoted as pins 606C, 608C, and 610C) after substrate 306 is translated along the x-direction by distance $\Delta y1$.

One skilled in the art will recognize, after reading this Specification, that in embodiments wherein it is desired to mechanically pre-load movable element 106 with a pre-determined level of strain, the position of shoulder 604 along the y-direction would be displaced from its position as shown in FIGS. 6A-C by an amount equal to $\Delta y2$, as discussed above and with respect to FIGS. 4 and 5D.

It should be noted that the number of alignment systems 600 included on substrates 102 and 306, as well as their position on the substrates, are matters of design choice. Further, the size of the shoulders and pins are also matters of design choice and will depend, in part, on their location on their respective substrate.

Returning now to method 200, at operation 205, substrates 102 and 306 are subjected to a high-temperature anneal that bonds surface 302 of spacer pad 110 to surface 316 of anchor 104. This results in a mechanically stable bond between anchor 104 and spacer pad 110. After operation 205, movable element 106 and surface 116 are separated by a distance equal to the thickness of spacer pad 110 (i.e., thickness t1).

Figure 3C:
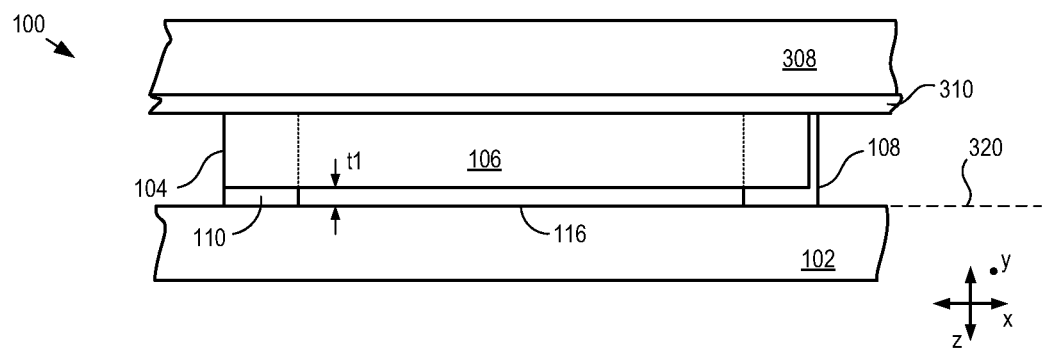
FIG. 3C depicts a schematic drawing of device 100 after substrates 102 and 306 have been joined at spacer pad 110 and anchor 104.

FIG. 3C depicts a schematic drawing of device 100 after substrates 102 and 306 have been joined at spacer pad 110 and anchor 104.

At operation 206, base substrate 308 is removed from device 100 to complete its fabrication. Base substrate 308 is removed from device 100 in conventional fashion, such as by selectively etching release layer 310 in an etchant that does not significantly attack other materials included in device 100. In some embodiments, base substrate 308 and release layer 310 are removed via a removal process, such as reactive-ion etching, jet etching, wet etching, and the like. It will be clear one skilled in the art, after reading this Specification, how to remove base substrate 308 and release layer 310 from device 100.

Figure 3D:
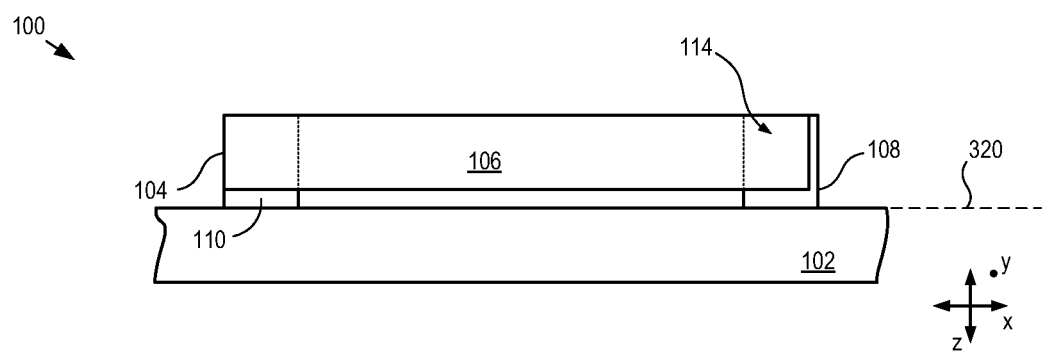
FIG. 3D depicts a schematic drawing of device 100 after base substrate 308 and release layer 310 have been removed.

FIG. 3D depicts a schematic drawing of device 100 after base substrate 308 and release layer 310 have been removed.

After operation 206, free end 114 of movable element 106 is in physical contact with contact structure 108; however, free end is also selectively movable along a direction substantially parallel with plane 320.

Although the illustrative embodiment comprises a movable element that is a simple homogeneous, rectangular beam, in some embodiments, movable element 106 includes regions of different material, or is physically attached to another element that moves with the movable element, wherein that element comprises a material different than that of the movable element. As a result, in some embodiments, different regions of movable element 106 can have different material characteristics. Further, in some embodiments, movable element can have different regions that are electrically and/or thermally, and/or magnetically isolated from one another, or be physically attached to another element from which the movable element is electrically and/or thermally, and/or magnetically isolated.

FIG. 3E depicts a schematic drawing of a top view of an assembly comprising a movable element that is physically coupled with, but electrically, magnetically, and substantially thermally isolated from another movable element. Assembly 322 includes movable element 106, which is physically coupled with armature 324 via neck 326.

Armature 324 comprises ferromagnetic material and is operative for magnetically coupling with magnetic poles 328 and 330. Armature 324 channels magnetic field M between magnetic pole 328 and magnetic pole 330 when the poles are suitably magnetized.

Neck 326 is a narrow region of non-magnetic, electrically insulating, and thermally insulating material, such as a glass or other dielectric, ceramic, composite material, etc. The material of neck 326 is selected to provide magnetic, electrical, and thermal isolation between movable element 106 and armature 324, while simultaneously enabling these structures to be bonded at mating vertical surfaces. As a result, current flow I flows through movable element 106 but not through armature 324, while magnetic field M resides in armature 324 but not in movable element 106.

One skilled in the art will recognize, after reading this Specification, that a sequence of operations in accordance with method 200 can be used to join movable element 106 and neck 326, as well as neck 326 and armature 324. The operations would typically be performed separately from the operations used to join anchor 104 and spacer pad 110.

FIG. 3F depicts a schematic drawing of a top view of another assembly comprising a movable element that is physically coupled with, but electrically isolated from, another movable element. Assembly 332 includes movable element 106, neck 326, electrodes 334 and 336, terminal 338, and tether 340.

Movable element 106 is physically coupled with electrode 334 via neck 326, which electrically isolates movable element 106 from electrode 334.

Each of electrodes 334 and 336, terminal 338, and tether 340 comprises electrically conductive material. Electrode 334 is electrically connected to terminal 338 via tether 340.

Terminal 338 is a conventional electrical terminal that is electrically connected to electrode 334 via tether 340. Each of terminal 338 and electrode 336 is electrically connected such that a voltage differential can be applied between them.

Tether 340 is a conventional spring tether that is designed to enable electrical communication between terminal 338 and electrode 334, while simultaneously allowing motion of electrode 334 within the x-y plane.

Electrodes 334 and 336 collectively define an electrostatic actuator operative for moving movable element within the x-y plane. A voltage differential applied between terminal 338 and electrode 336 gives rise to an attractive electrostatic force between the electrodes. Since electrode 334 is physically coupled with movable element 106, the electrostatic force causes movable element 106 to move toward electrode 336.

Since electrode 334 is electrically isolated from movable element 106 via neck 326, the voltage applied to the electrode does not affect the flow of current I through movable element 106.

Electrical Devices

Figure 7A:
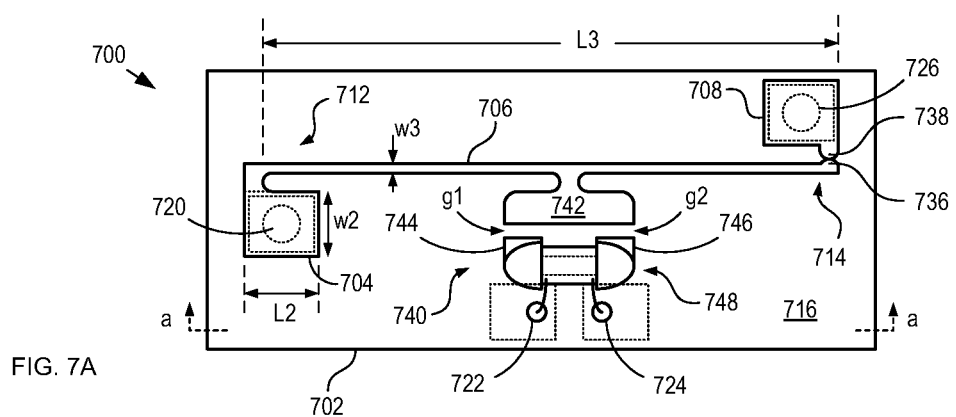
FIG. 7A depicts a schematic drawing of a top view of a laterally actuated, normally closed microrelay in accordance with the present invention.

FIG. 7A depicts a schematic drawing of a top view of a laterally actuated, normally closed microrelay in accordance with the present invention. Microrelay 700 is a micromechanical device that comprises substrate 702, anchor 704, reed 706, contact 708, and actuator 740.

Figure 8:
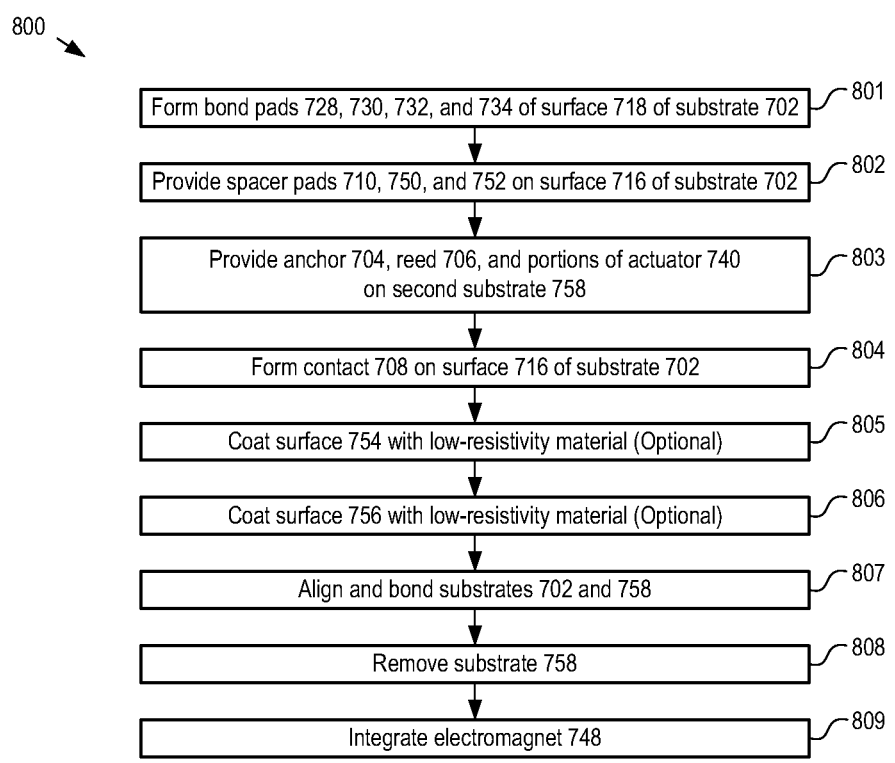
FIG. 8 depicts operations suitable for forming microrelay 700.

FIG. 8 depicts operations suitable for forming microrelay 700. Method 800 is analogous to method 200 described above and with respect to FIG. 2. Method 800 begins with operation 801, wherein bond pads 728, 730, 732, and 734 are formed on surface 718 of substrate 702 in conventional fashion.

Substrate 702 is analogous to substrate 102 described above and with respect to FIG. 1; however, substrate 702 includes through-wafer vias 720, 722, 724, and 726, which enable electrical communication between features disposed on surfaces 716 and 718 of substrate 202. As a result, microrelay 700 can be electrically connected with another substrate, such as a printed circuit board, multi-chip module substrate, etc. via conventional solder-bump bonding. In some embodiments, substrate 702 does not include through-wafer vias and conventional wire bonds and/or tab bonds are used to electrically connect microrelay 700 to another electrical component or components.

Through-wafer vias 720, 722, 724, and 726 are conventional vias that comprise a center region of electrically conductive material, such as doped polysilicon or metal, that is surrounded by an annulus of electrically insulating material, such as silicon dioxide. As a result, the through-wafer vias are electrically isolated from one another as well as substrate 702. In some embodiments, substrate 702 comprises an insulating material and, therefore, through-wafer vias formed through the substrate do not require a surrounding insulator material for electrical isolation.

Bond pads 728, 730, 732, and 734 are conventional electrical bond pads formed such that they are electrically connected to through-wafer vias 720, 722, 724, and 726, respectively.

At operation 802, spacer pads 710, 750, and 752, each having a thickness of approximately 5 microns, are formed on surface 716 of substrate 702. Each of spacer pads 710, 750, and 752 is analogous to spacer pad 110.

At operation 803, anchor 704, reed 706, and portions of actuator 740 are formed on second substrate 758 (not shown for clarity) in analogous fashion to the formation of anchor 104 and movable element 106 on substrate 306, as described above and with respect to FIG. 3B. Second substrate 758 is analogous to substrate 306.

Anchor 704 is a substantially rectangular region of ferromagnetic material, (e.g., iron, nickel, Permalloy, neodymium, yttrium iron garnet (YAG), etc.) having lateral dimensions, L2×w2, of approximately 0.7 mm×0.5 mm and a height, h2, of approximately 500 microns.

Reed 706 extends from anchor 704 and has length, L3, of approximately 2.5 mm, and a width, w3, of approximately 4 microns. Reed 706 and anchor 704 are formed as a contiguous region of ferromagnetic material. As a result, reed 706 comprises the same material as anchor 704 and also has height, h2. Reed 706 is analogous to movable element 106 described above; however, reed 706 includes contact point 736, which facilitates good electrical contact between reed 706 and contact 708 by concentrating contact force between them to their mating surfaces.

It should be noted that reed 706 extends from the side of anchor 704 that is distal to end 714 of reed 706 to substantially maximize the length, L2, of reed 706 without increasing the footprint of microrelay 700. As discussed above, the actuator force required to move end 714 is inversely proportional to the cube of its length, L2. By extending the reed from a point on anchor 706 that is furthest from end 714, the required actuation force is substantially minimized for the structure of microrelay 700. In some embodiments, reed 706 extends from a different point on anchor 704.

Actuator 740 is an electromagnetic actuator suitable for controlling the state of electromagnetic relay based on an electrical signal applied between a third terminal, at bond pad 722, and a fourth terminal, at bond pad 724. Actuator 740 comprises armature 742, poles 744 and 746, and electromagnet 748, which is included in microrelay 700 via hybrid integration, as discussed below. During operation 803, however, armature 742, poles 744 and 746 are formed on second substrate 758 at the same time as anchor 704 and reed 706.

Armature 740 is a region of ferromagnetic material suitable for magnetically coupling with poles 744 and 746 via gaps g1 and g2. Armature 740 is formed as a portion of the contiguous region that also includes anchor 704 and reed 706.

Poles 744 and 746 are regions of ferromagnetic material that serve to facilitate the development of magnetic force between electromagnet 748 and reed 706, as discussed below. Since poles 744 and 746 are formed in the same operations used to form anchor 704 and reed 706, poles 744 and 746 comprise the same material and have the same thickness as the anchor and reed. In some embodiments, poles 744 and 746 are formed in a separation operation and can, therefore, comprise a different material and/or have a different thickness than that of anchor 704 and reed 706.

At operation 804, contact 708 is formed on surface 716 of substrate 702. Contact 708 is a substantially rectangular region that comprises the same material and has substantially the same lateral dimensions as anchor 704 (i.e., approximately 0.7 mm×0.5 mm) and a height, h3, of approximately 505 microns, which is the sum of the thickness of spacer pad 710 and the height of reed 706. In some embodiments, contact 708 has a height different than the sum of the thickness of space pad 710 and the height of reed 706. In some embodiments, contact 708 has different lateral dimensions and/or comprises a different material than anchor 104. Anchor 704 is analogous to anchor 104 described above; however, anchor 704 includes contact point 738, which is analogous to contact point 736.

Contact point 738 is electrically connected to a second terminal at bond pad 734 via contact 708 and through-wafer via 726.

At optional operation 805, surface 754 of contact point 736 is coated with a material having low electrical resistivity, such as gold, ruthenium, rhodium, and the like, to decrease its contact resistance.

At optional operation 806, surface 756 of contact point 738 is coated with a material having low electrical resistivity, such as gold, ruthenium, rhodium, and the like, to decrease its contact resistance.

The coating of vertical surfaces 754 and 756 is facilitated by the fact that these surfaces are located on structures disposed on separate substrates. As a result, they can be coated with a low-resistivity material using any of several conventional methods, such as directional evaporation, sputtering, gas-phase deposition, etc.

At operation 807, substrates 702 and 758 are aligned and bonded, as discussed above and with respect to FIGS. 4-5, which leaves anchor 704 bonded with spacer pad 710 and poles 744 and 746 bonded with spacer pads 750 and 752, respectively. As a result, reed 706 is separated from surface 716 by a distance equal to t2 and is in physical contact with contact 708 such that contact points 736 and 738 are physically and electrically connected. Further, the substrates are preferably aligned and bonded such that mechanical energy is stored in reed 706.

After operation 807, contact point 736 is electrically connected to a first terminal at bond pad 728 via reed 706, anchor 704, and through-wafer via 720.

At operation 808, substrate 758 is removed as described above and with respect to micromechanical device 100.

At operation 809, electromagnet 748 is integrated into microrelay 700 via conventional hybrid integration techniques.

Electromagnet 748 comprises core 760 and coil 762.

During operation 809, core 760 is joined with poles 750 and 752 such that poles 750 and 752 are magnetically coupled with core 760.

Also during operation 809, coil 762 is electrically connected between through-wafer vias 722 and 724 via a conventional technology, such as wire bonding, tab bonding, and the like.

Figure 7B:
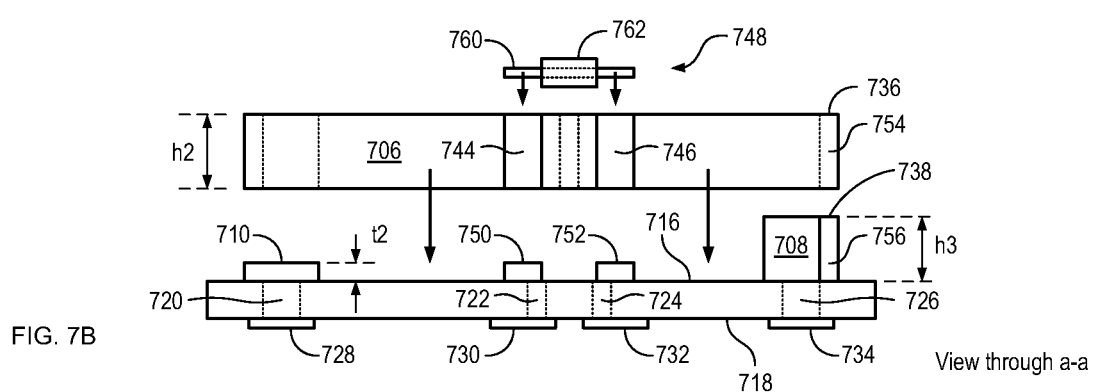
FIG. 7B depicts an assembly drawing of microrelay 700 through view a-a, as denoted in FIG. 7A.

FIG. 7B depicts an assembly drawing of microrelay 700 through view a-a, as denoted in FIG. 7A.

In operation, microrelay 700 controls the electrical connectivity between bond pads 728 and 734 based on the flow of electric current between bond pads 730 and 732 (i.e., through coil 762).

When no current flows through coil 762, reed 706 remains in its quiescent position and contact points 736 and 738 are in physical and electrical contact. Thus, the first and second terminals at bond pads 728 and 734, respectively, are electrically connected through reed 706.

When a suitable current flows through coil 762, poles 744 and 746 become energized, which induces a magnetic field in armature 742 and gaps g1 and g2. This magnetic field gives rise to an actuator force that pulls reed 706 toward poles 744 and 746, thereby pulling contact point 736 out of electrical contact with contact point 738 and opening the electrical contact between bond pads 728 and 734 through reed 706.

Although microrelay 700 is a micromechanical device that comprises an electromagnetic actuator, it will be clear to one skilled in the art, after reading this Specification, how to specify, make, and use alternative embodiments of the present invention that include an actuator other than an electromagnetic actuator. Actuators suitable for use in embodiments of the present invention include, without limitation, thermal actuators, electrostatic actuators, external magnet actuators, magnetostrictive actuators, microfluidic actuators, and piezoelectric actuators.

Figure 9A:
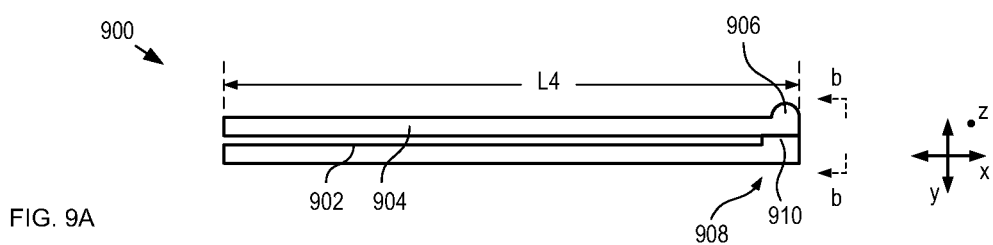
FIG. 9A depicts a schematic drawing of a top view of a portion of a thermal actuator suitable for inclusion in a movable element in accordance with the present invention.

FIG. 9A depicts a schematic drawing of a top view of a portion of a thermal actuator suitable for inclusion in a movable element in accordance with the present invention. Thermal actuator 900 comprises beam 902 and beam 904 and contact point 906. Thermal actuator 900 has free end 908, which is movable in a direction within the x-y plane, as shown.

Beam 902 is a substantially rectangular beam having projection 910 at end 908. Beam 902 is disposed on substrate 912. Beam 902 is held above substrate 912 by separation, t3, via a spacer pad (not shown for clarity), as discussed above. Beam 902 comprises a first substantially electrically conductive material having a first thermal expansion coefficient. At a first temperature, typically room temperature, beam 902 has length L4. In some embodiments, beam 902 comprises a material that is not electrically conductive.

Beam 904 is a substantially rectangular beam disposed on release layer 916, which is disposed on substrate 914. Beam 904 comprises a second substantially electrically conductive material having a second thermal expansion coefficient that is different than the first thermal expansion coefficient. At the first temperature, beam 904 also has length L4. Beam 904 includes contact point 906, as discussed above. In some embodiments, beam 904 comprises a material that is not electrically conductive.

Thermal actuator is formed using a method that is analogous to method 200, discussed above.

After beams 902 and 904 have been defined on their respective substrates, substrates 912 and 914 are positioned in an initial alignment position wherein beams 902 and 904 are not in physical contact. The substrates are then aligned in the x-direction and rotationally about the z-axis. This leaves surface 918 of projection 910 separated from surface 920 of beam 904.

Figure 9B:
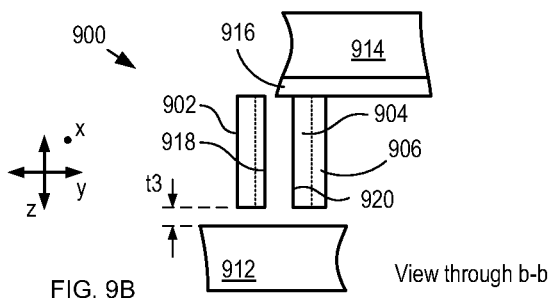
FIG. 9B depicts a schematic drawing of an end view of thermal actuator 900, through line b-b, after substrates 908 and 910 have been aligned in x-direction and rotationally about the z-axis, but before they have been aligned in the y-direction.

FIG. 9B depicts a schematic drawing of an end view of thermal actuator 900, through line b-b, after substrates 912 and 914 have been aligned in x-direction and rotationally about the z-axis, but before they have been aligned in the y-direction.

A final alignment along the y-direction brings surfaces 918 and 920 into physical contact. Once the surfaces are in contact with one another, the substrates are subjected to a high-temperature anneal that forms bonded interface 922. Bonded interface 922 immobilizes surfaces 918 and 920 with respect to one another; thereby converting beams 902 and 904 into a bi-material strip. Bonded interface 922 also electrically connects beams 902 and 904 at free end 908.

After the bonding step, substrate 914 and release layer 916 are removed.

Figure 9C:
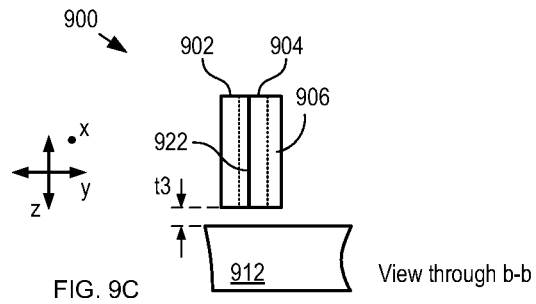
FIG. 9C depicts a schematic drawing of an end view of thermal actuator 900, through line b-b, after formation of bonded interface 916.

FIG. 9C depicts a schematic drawing of an end view of thermal actuator 900, through line b-b, after formation of bonded interface 922.

In operation, thermal actuator 900 is actuated by resistive heating induced by an electric current injected through the serial combination of beams 902 and 904. In some embodiments, thermal actuator 900 is heated by a means other than resistive heating, such as radiant heating, conductive heating, a change in ambient temperature, etc.

Figure 9D:
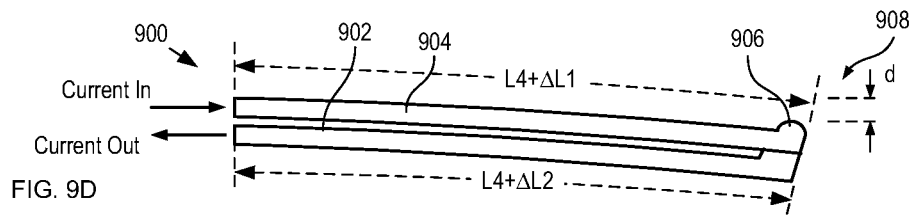
FIG. 9D depicts a schematic drawing of a top view of thermal actuator 900 after it has been actuated.

FIG. 9D depicts a schematic drawing of a top view of thermal actuator 900 after it has been actuated.

When the temperature of thermal actuator 900 is increased, the length of beam 902 increases by $\Delta L1$ and the length of beam 904 increases by $\Delta L2$. Because the thermal expansion coefficients of the first and second materials are different, $\Delta L1$ and $\Delta L2$ are different, which gives rise to a deflection of free end 908 by distance d.

Figure 10A:
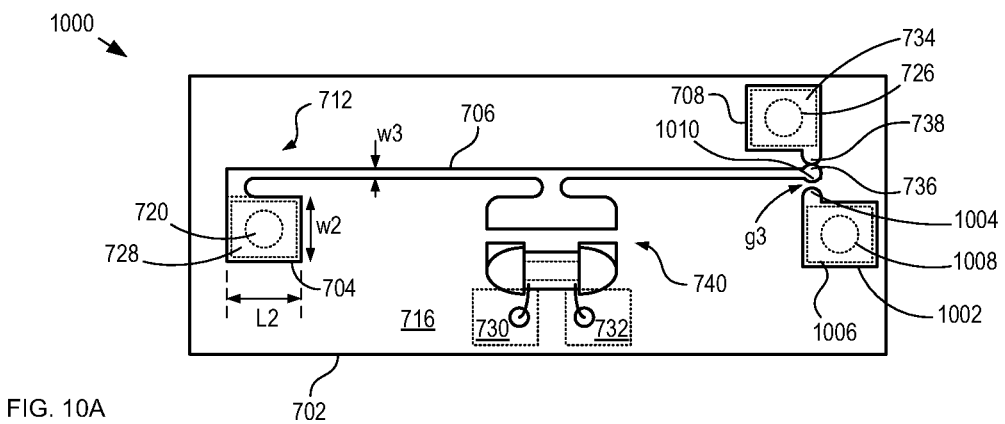
FIG. 10A depicts a schematic drawing of a top view of a single-pole, double-throw microrelay in accordance with the present invention.

FIG. 10A depicts a schematic drawing of a top view of a single-pole, double-throw microrelay in accordance with the present invention. Microrelay 1000 is a micromechanical device that comprises microrelay 700, contact point 1002, contact 1004, contact point 1006, and bond pad 1008, and through-wafer via 1010.

Contact 1002 is analogous to contact 708, described above. Contact 1002 includes contact point 1004, which is electrically connected with bond pad 1006 via contact 1002 and through-wafer via 1008.

Contact point 1010 is analogous to contact point 728 described above. Contact point 1010 is located on the side of beam 706 that is proximate to contact 1002.

In operation, when beam 706 is in its quiescent position, contact points 736 and 738 are in physical and electrical contact, while contact points 1004 and 1010 are separated by gap, g3. As a result, bond pads 728 and 734 are electrically connected via beam 706 but bond pads 728 and 1006 are not electrically connected via beam 706.

When actuator 740 imparts a force on beam 706, however, the beam moves to its actuated position and closes gap g3. As a result, contact points 1004 and 1010 move into physical and electrical contact, which establishes electrical contact between bond pads 728 and 1006. At the same time, the motion of beam 706 separates contact points 736 and 738 breaking the electrical contact between bond pads 728 and 734 via beam 706.

One skilled in the art will recognize that microrelay 1000 can be formed by operations analogous to those described above. Furthermore, an additional bonding operation can be performed to provide at least one of beam 706 and contacts 708 and 1002 with a contact point that is resilient such that microrelay 1000 can operate in a "make before break" mode of operation.

Figure 10B:
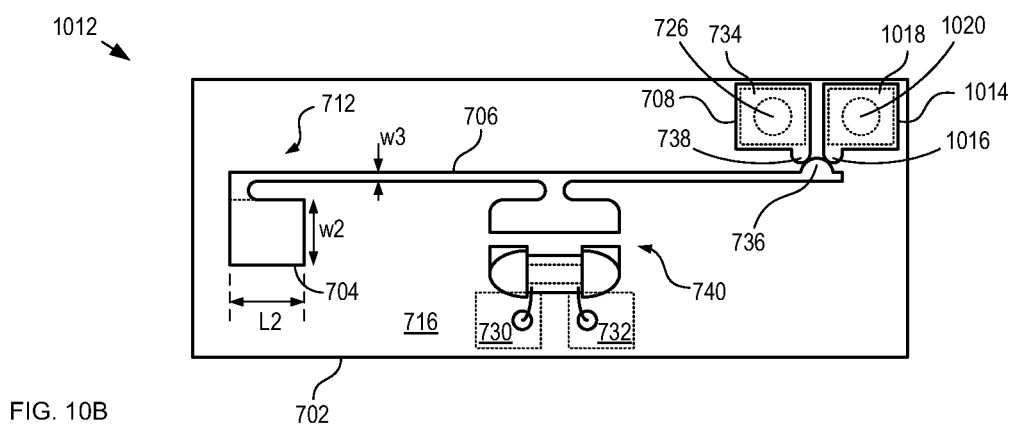
FIG. 10B depicts a schematic drawing of a top view of a single-pole, single-throw microrelay in accordance with the present invention.

FIG. 10B depicts a schematic drawing of a top view of a single-pole, single-throw microrelay in accordance with the present invention. Microrelay 1012 is a micromechanical device that is comprises substrate 702, anchor 704, beam 706, contact 708, contact point 736, actuator 740, contact 1014, contact point 1016, bond pads 730, 732, 734, and 1018, and through-wafer via 1020.

Contact 1014 is analogous to contact 708. Contact 1014 includes contact point 1016, which is electrically connected with bond pad 1018 via contact 1014 and through-wafer via 1020.

In operation, when beam 706 is in its quiescent position, contact point 736 is in physical and electrical contact with both of contact points 738 and 1016. As a result, when microrelay is unactuated, bond pads 734 and 1020 are electrically connected via contact point 736.

When actuator 740 imparts a force on beam 706, however, contact point 736 is drawn away from contact points 738 and 1016, thereby breaking the electrical contact between bond pads 734 and 1020 via contact point 736.

Microrelays 700, 1000, and 1012 represent only three examples of electrical switching devices in accordance with the present invention. It will be clear to one skilled in the art, after reading this Specification, how to specify, make, and use alternative electrical devices having any practical configuration of elements, such as the embodiments disclosed in U.S.

Pat. No. 8,258,900, to which the present application claims priority and which is incorporated in its entirety herein by reference.

Microfluidic Devices

Figure 11:
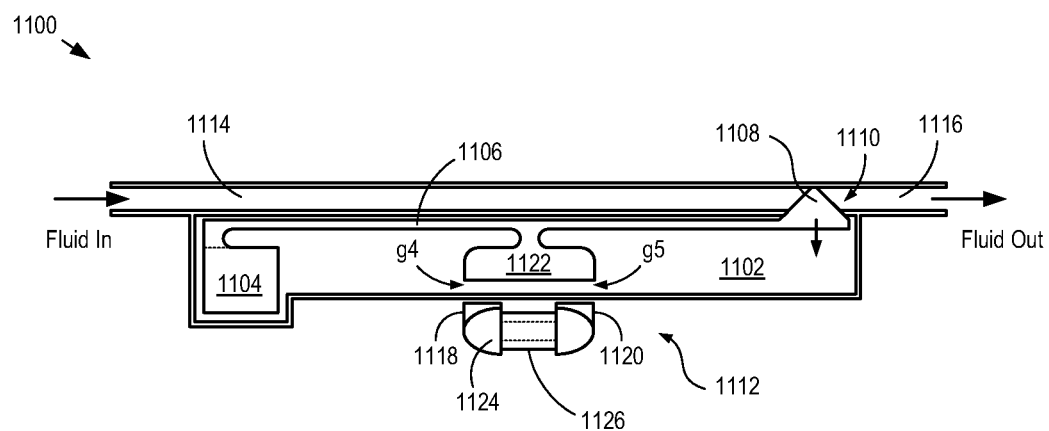
FIG. 11 depicts a schematic drawing of a top view of a microfluidic valve in accordance with the present invention.

FIG. 11 depicts a schematic drawing of a top view of a microfluidic valve in accordance with the present invention. Valve 1100 comprises reservoir 1102, anchor 1104, beam 1106, valve member 1108, valve seat 1110, and actuator 1112. Valve 1100 controls the flow of fluid from conduit 1114 to conduit 1116.

Reservoir 1102 and conduits 1114 and 1116 are conventional microfluidic structures. It will be clear to one skilled in the art how to make and use reservoir 1102 and conduits 1114 and 1116.

Reservoir 1102 is a microfluidic chamber for containing fluid from conduit 1114 that leaks around valve member 1108 when valve 1100 is opened.

Anchor 1104, beam 1106, and actuator 1112 are analogous to anchor 704, beam 706, and actuator 748 described above and with respect to FIGS. 7A-B. Anchor 1104, beam 1106, and the moving parts of actuator 1112 are formed within reservoir 1102, however. The fabrication of valve 1100 is analogous to the fabrication of microrelay 700, as described above; however it is performed after the formation of reservoir 1102 and conduits 1114 and 1116.

Valve member 1108 is a mechanical structure having a shape suitable for blocking flow of fluid from conduit 1114 to conduit 1116 when valve 1100 is in its quiescent position. Valve member 1108 is designed to closely fit within valve seat 1110.

Valve seat 1110 is an opening in the sidewall of the conduit structure that enables valve member 1108 to be inserted into the space between conduit 1114 and conduit 1116.

Actuator 1112 comprises poles 1118 and 1120, armature 1122, core 1124, and coil 1126.

The lateral position of valve member 1108 is controlled by the magnetic force generated between poles 1118 and 1120 and armature 1122 through gaps g3 and g4. The magnitude of this force is based on the magnitude of the current flow through coil 1126.

It should be noted that valve 1100 is merely one example of a microfluidic system in accordance with the present invention and that many alternative embodiments of microfluidic systems, comprising normally closed and/or normally open valves, for example, are within the scope of the present invention.

It is to be understood that the disclosure teaches only a few examples of embodiments and that many variations of the invention can easily be devised by those skilled in the art after reading this disclosure and that the scope of the present invention is to be determined by the following claims.

What is claimed is:

1. A method for forming a micromechanical device, the method comprising:
   providing a first substrate that defines a first plane, the first substrate comprising a first base substrate and a first element, the first element having a first end that is operable to move along a first direction that is substantially parallel with the first plane;
   providing a second substrate that defines a second plane, the second substrate comprising a second base substrate and a first contact structure;
   bonding the first substrate and the second substrate such that (1) the first plane and second plane are substantially parallel, (2) the first end is in physical contact with the first contact structure, (3) motion of the first end along the first direction moves the first end out of physical contact with the first contact structure, and (4) the first element is operatively coupled with an actuator operable for moving the first end along the first direction; and
   removing at least one of the first base substrate and the second base substrate.

2. The method of claim 1 wherein the first substrate and second substrate are bonded such that a strain is induced in the first element, the strain having a component along a direction substantially parallel with the first plane.

3. The method of claim 1 wherein the first substrate is provided such that the first end comprises a first material and has a first surface that is non-co-planar with the first plane, and wherein the method further comprises:
   forming a first layer on the first surface, the first layer comprising a second material that is different than the first material.

4. The method of claim 1 wherein the first substrate is provided such that it further includes a first terminal that is in electrical communication with the first end, and wherein the second substrate is provided such that it further includes a second terminal that is in electrical communication with the first contact structure, and further wherein the first terminal and second terminal are in electrical communication when the first end and first contact structure are in physical contact and are not in electrical communication when the first end and first contact structure are not in physical contact.

5. The method of claim 1 wherein the first substrate and second substrate are bonded by operations comprising:
   placing the first substrate and second substrate into physical contact such that the first end and the first contact structure are not in physical contact;
   moving the first substrate and second substrate relative to one another with a first motion along a second direction to put a first feature disposed on the first substrate into physical contact with a second feature disposed on the second substrate, wherein physical contact between the first feature and second feature limits the first motion; and
   moving the first substrate and second substrate relative to one another with a second motion along a third direction to put a third feature disposed on the first substrate into physical contact with a fourth feature disposed on the second substrate, wherein the second motion places the first end and the first contact structure into physical contact, and wherein physical contact between the third feature and fourth feature limits the second motion.

6. The method of claim 5 further comprising providing the third feature and the fourth feature such that they collectively define a latch that locks the relative position of the first substrate and second substrate along the first direction.

7. The method of claim 6 wherein the third feature and the fourth feature are provided such that the latch locks the relative position of the first substrate and second substrate in a plane substantially parallel with the first plane.

8. The method of claim 1 wherein the first substrate and second substrate are provided such that the actuator moves the first end along the first direction in response to the application of a first magnetic field.

* * * * *